United States Patent [19]

Ikemasu

[11] Patent Number: 5,637,522
[45] Date of Patent: Jun. 10, 1997

[54] METHOD FOR PRODUCING A DYNAMIC RANDOM ACCESS MEMORY DEVICE WHICH INCLUDES MEMORY CELLS HAVING CAPACITOR FORMED ABOVE CELL TRANSISTOR AND PERIPHERAL CIRCUIT FOR IMPROVING SHAPE AND ASPECT RATIO OF CONTACT HOLE IN THE PERIPHERAL CIRCUIT

[75] Inventor: Shinichirou Ikemasu, Kawasaki, Japan

[73] Assignee: Fujitsu Limited, Takahashi, Japan

[21] Appl. No.: 438,917

[22] Filed: May 10, 1995

Related U.S. Application Data

[62] Division of Ser. No. 255,902, Jun. 7, 1994, abandoned, which is a continuation of Ser. No. 5,423, Jan. 19, 1993, abandoned, which is a continuation of Ser. No. 784,730, Oct. 28, 1991, abandoned, which is a continuation of Ser. No. 518,585, May 2, 1990, abandoned.

[30] Foreign Application Priority Data

May 10, 1989 [JP] Japan ..................... 1-116402

[51] Int. Cl.$^6$ ..................... H01L 21/70; H01L 27/00
[52] U.S. Cl. ..................... 438/396
[58] Field of Search ..................... 437/52, 60, 919

[56] References Cited

U.S. PATENT DOCUMENTS

| | | | |
|---|---|---|---|
| 4,327,476 | 5/1982 | Iwai | 29/571 |
| 4,742,018 | 5/1988 | Kimura | 437/48 |
| 4,784,969 | 11/1988 | Nitayama | 437/41 |
| 4,793,975 | 12/1988 | Drage | 156/345 |
| 4,845,544 | 7/1989 | Shimizu | 257/306 |
| 4,905,064 | 2/1990 | Yabu | 357/236 |
| 4,953,216 | 8/1990 | Ema | 365/182 |

FOREIGN PATENT DOCUMENTS

| | | |
|---|---|---|
| 0 191 612 | 8/1986 | European Pat. Off. . |
| 0 224 213 | 6/1987 | European Pat. Off. . |
| 59-231851 | 12/1984 | Japan . |
| 62-179759 | 8/1987 | Japan . |
| 63-237439 | 10/1988 | Japan . |
| 63-237439 | 12/1988 | Japan . |
| 1-80065 | 3/1989 | Japan . |
| 2-58866 | 2/1990 | Japan . |

Primary Examiner—Jey Tsai
Attorney, Agent, or Firm—Armstrong, Westerman, Hattori, McLeland & Naughton

[57] ABSTRACT

A polycrystal silicon layer is used to a cell plate of a capacitor in a memory cell portion including a plurality of memory cells, and a $Si_3N_4$ film layer is used to form a capacitor above a first transistor in the memory cell. The polycrystal silicon layer and $Si_3N_4$ film layer formed above a second transistor in a peripheral circuit are simultaneously removed by an etching method during the same process. Therefore an aspect ratio and a shape of a contact hole in the peripheral circuit are improved, and thus the step coverage of the wiring in the peripheral circuit can be improved.

9 Claims, 15 Drawing Sheets

METHOD FOR PRODUCING A DYNAMIC RANDOM ACCESS MEMORY DEVICE WHICH INCLUDES MEMORY CELLS HAVING CAPACITOR FORMED ABOVE CELL TRANSISTOR AND PERIPHERAL CIRCUIT FOR IMPROVING SHAPE AND ASPECT RATIO OF CONTACT HOLE IN THE PERIPHERAL CIRCUIT

This is a Divisional application of Ser. No. 08/255,902, filed Jun. 7, 1994 abandoned, which is Continuation application of Ser. No. 08/005,423, filed Jan. 19, 1993 abandoned, which is a Continuation application of Ser. No. 07/784,730, filed Oct. 28, 1991 abandoned, which is a Continuation application of Ser. No. 07/518,585 filed May 2, 1990 abandoned.

BACKGROUND OF THE INVENTION

1. Field of the Invention

The present invention relates to a method of producing a semiconductor memory device, more particularly, to a method of producing a dynamic random access memory (hereafter, called a DRAM) having a fin structure type (lamination type) capacitor formed above a substrate. Furthermore, the present invention relates to a DRAM device, more particularly, to a DRAM device comprising a memory cell portion including a plurality of memory cells and a peripheral circuit. Note, the memory cell includes a transfer gate transistor and a fin structure type capacitor formed above the transfer gate transistor, and the peripheral circuit includes a transistor having a contact hole passing through an insulation layer and reaching to a drain or a source region of the transistor.

2. Description of the Related Art

Recently, a DRAM device having a fin structure type capacitor formed above a substrate has been developed. The fin structure type capacitor is suitable for a mass storage DRAM, for example, 4M bits, 16M bits and the like, as a part of the fin structure type capacitor can be formed on a transfer gate transistor. Therefore, recently, various DRAMs having such a fin structure type capacitor have been studied and proposed.

In such a DRAM, it is required that a parasitic capacitance of a bit line be lowered to decrease power consumption and stabilize operation. Therefore, it is preferable that the thickness of an insulation layer above the bit line, which is provided in the memory cell portion, is thickly formed. Neverthless, when the insulation layer is thickly formed, an aspect ratio of the contact hole formed in the peripheral circuit becomes large. Therefore, coverage of an aluminium wiring layer becomes worse, and the aluminium wiring layer may be snapped.

On the other hand, in order to decrease the aspect ratio of the contact hole formed in the peripheral circuit, a concept of decreasing the thickness of the insulation layer in the peripheral circuit without decreasing the thickness of the insulation layer in the memory cell portion is proposed in Unexamined Japanese Patent Publication (Kokai) No. 02-58866 as a related art. Namely, in JPP '866, it is disclosed that a depth of the contact hole formed in the peripheral circuit is reduced by etching some of the insulation layers and decreasing the thickness of the insulation layers in the peripheral circuit. In a DRAM device in JPP '866, a capacitor is formed above a substrate, but the capacitor is not constituted as a fin structure type capacitor and a silicon nitride ($Si_3N_4$) film layer is not provided in the memory cell portion. Therefore, a problem of a shape of the contact hole in the peripheral circuit is not considered. Conversely, in the DRAM device having the fin structure type capacitor, the $Si_3N_4$ film layer is necessary for forming the fin structure type capacitor above the transfer gate transistor in the memory cell portion, and the shape of the contact hole in the peripheral circuit is an important problem in terms of reliability of the aluminium wiring. These problems will be described after in detail.

SUMMARY OF THE INVENTION

It is an object of the present invention to provide a DRAM and producing method thereof for decreasing power consumption and stabilizing the operation of the memory cell by decreasing parasitic capacitance of a bit line, and for improving the step coverage of the wiring by improving an aspect ratio and the shape of a contact hole in a peripheral circuit.

According to the present invention, there is provided a method of producing a semiconductor memory device, wherein the method comprises steps of forming insulation film layers onto a first semiconductor element and a second semiconductor element, the first semiconductor element being used to constitute a memory cell formed on a semiconductor substrate, and the second semiconductor element being used to constitute a peripheral circuit except the memory cell formed on the semiconductor substrate; a step of forming a conductive layer onto the top insulation layer of the insulation film layers, and the conductive layer being used in a memory cell portion including the memory cell; a step of removing the conductive layer and at least the top insulation layer formed above the second semiconductor element; and a step of making a contact hole passing through the insulation film layers except the top insulation layer, and reaching to a surface of the second semiconductor element.

The memory cell is constituted by the first semiconductor element and a capacitor element formed on the top insulation layer and above the first semiconductor element. The top insulation layer is used to form the capacitor element above the first semiconductor element.

The conductive layer may be constituted by a polycrystal silicon layer, the top insulation layer may be constituted by a $Si_3N_4$ film layer, and the insulation film layers except the top layer may be constituted by $SiO_2$ film layers. The conductive layer of polycrystal silicon and top insulation layer of $Si_3N_4$ formed on the second semiconductor element may be removed by an etching method using mixed gas. The mixed gas may be made of sulfur hexafluoride and freon type gas.

According to the present invention, there is also provided a method of producing a semiconductor memory device, wherein the method comprises: a step of forming a first insulation film layer onto a first semiconductor element and a second semiconductor element, the first semiconductor element being used to constitute a memory cell formed on a semiconductor substrate, and the second semiconductor element being used to constitute a peripheral circuit except the memory cell formed on the semiconductor substrate, a step of forming a first conductive layer over the substrate, and the first conductive layer being patterned in the shape of a bit line and electrically connected to the first semiconductor element, a step of forming a second insulation film layer extending over the substrate; a step of forming a second conductive layer onto the second insulation film layer, and the second conductive layer being used as a cell plate of a capacitor element in a memory cell portion including the memory cell; a step of orderly removing at least the second conductive layer and the second insulation film layer formed on the second semiconductor element; and a step of making a contact hole passing through at least the first insulation film layer without passing through the second insulation film layer, and reaching to a surface of the second semiconductor element.

The method of producing a semiconductor memory device may further comprise a step of forming a third insulation film layer between the first insulation film layer and the second insulation film layer.

The method of producing a semiconductor memory device may further comprise: a step of forming a fourth insulation film layer onto the second insulation film layer, the fourth insulation film layer being made of a different material from the second insulation film layer; a step of forming a hole passing through the fourth, second, third, and first insulation film layers, and reaching to a surface of the first semiconductor element; a step of forming a third conductive layer onto the fourth insulation film layer, and the third conductive layer being used as a storage electrode of the capacitor element; a step of removing the fourth insulation film layer by an etching method down to the surface of the second insulation film layer; and a step of forming a capacitor insulation film covering the storage electrode of the capacitor element.

The first, second and third conductive layers may be constituted by polycrystal silicon layers, the first, third and fourth insulation film layers may be constituted by $SiO_2$ film layers, and the second insulation film layer may be constituted by a $Si_3N_4$ film layer.

According to the present invention, there is provided a semiconductor memory device having a memory portion including a plurality of memory cell and a peripheral circuit, wherein the device comprises: a first semiconductor element, formed on a semiconductor substrate, for constituting the memory cell; a second semiconductor element, formed on the semiconductor substrate, for constituting the peripheral circuit; a first insulation film layer, formed onto the first semiconductor element and the second semiconductor element; a second insulation film layer, formed onto the first insulation film layer only in the area of the memory cell portion; a conductive layer formed onto the second insulation film layer only in the area of the memory cell portion; and a contact hole, provided in the second semiconductor element, for constructing the peripheral circuit by wiring, and the contact hole being formed to pass through at least the first insulation film layer and reach to a surface of the second semiconductor element, without passing through the second insulation film layer.

The semiconductor memory device may further comprise a capacitor element, formed onto the second insulation film layer and above the first semiconductor element, for constituting the memory cell; the capacitor element may comprise a first polycrystal silicon layer for forming a storage electrode, a capacitor insulation film covering the storage electrode, and a second polycrystal silicon layer of the conductive layer. The capacitor element may comprise a plurality of storage electrodes.

The semiconductor memory device may further comprise a third insulation film layer between the first insulation film layer and the second insulation film layer. The first and third insulation film layers may be constituted by $SiO_2$ film layers, and the second insulation film layer may be constituted by a $Si_3N_4$ film layer.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

First, a DRAM device and a producing method thereof according to the prior art will be explained, with reference to FIGS. 1A to 2H.

FIGS. 1A to 1H are sectional diagrams for explaining a method of producing a DRAM of an example according to the prior art.

Figure 1A:
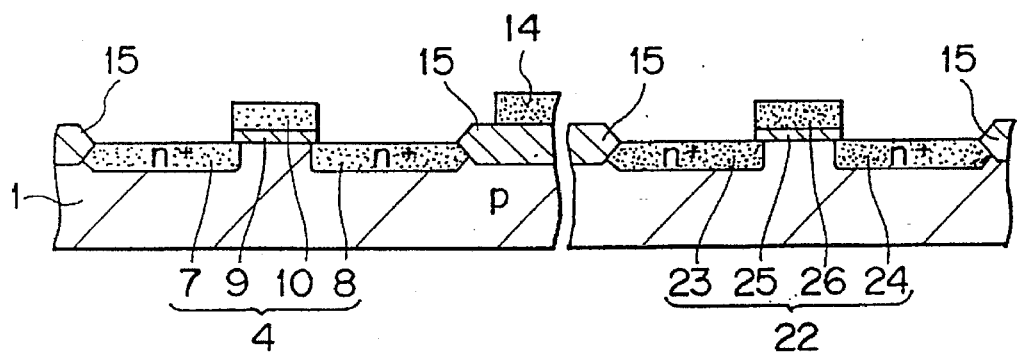
FIGS. 1A to 1H are sectional diagrams for explaining a method of producing a DRAM of an example according to the prior art.
Figure 1B:
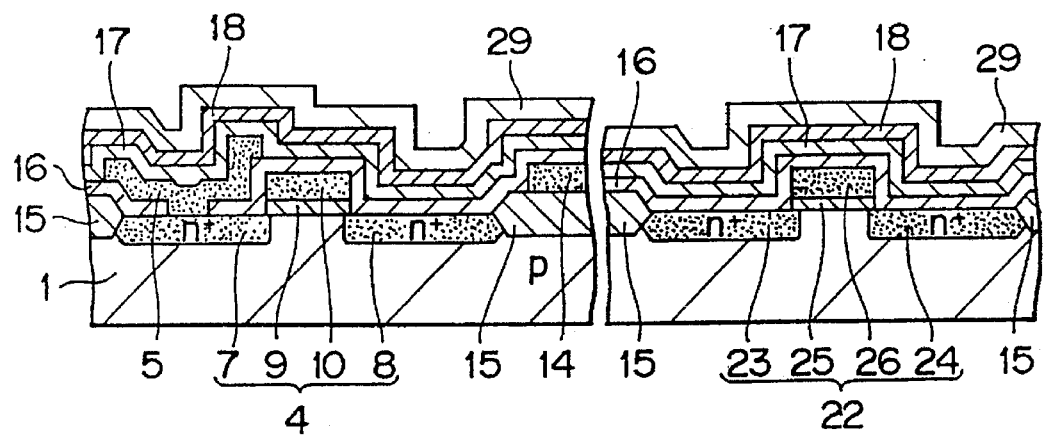
Figure 1C:
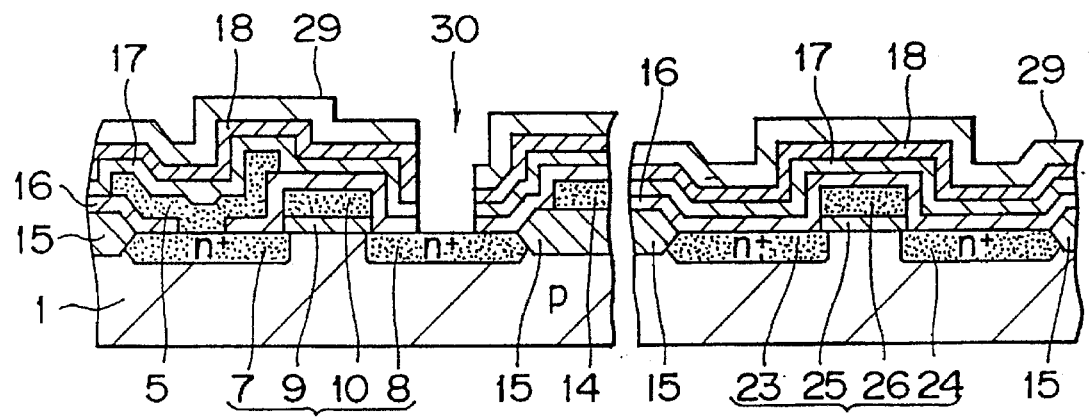
Figure 1D:
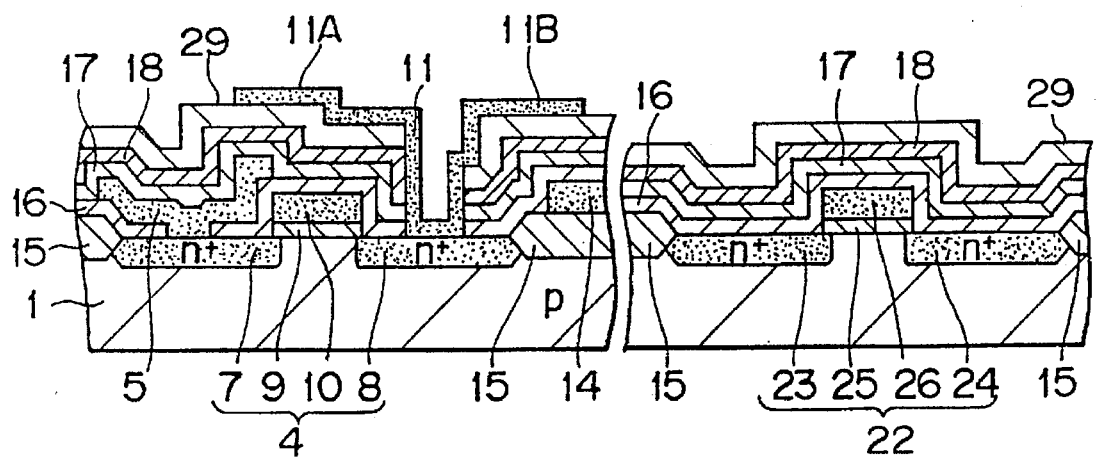
Figure 1E:
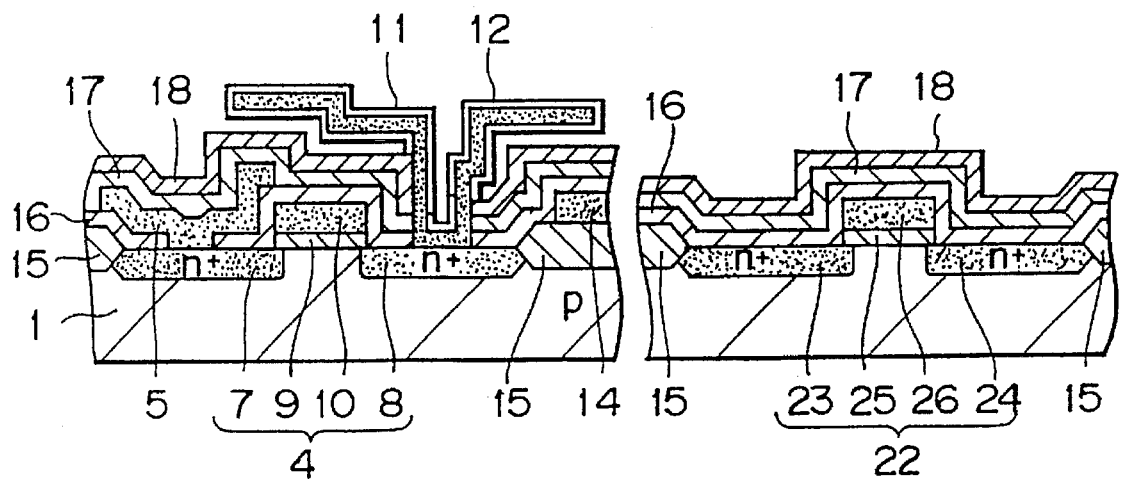
Figure 1F:
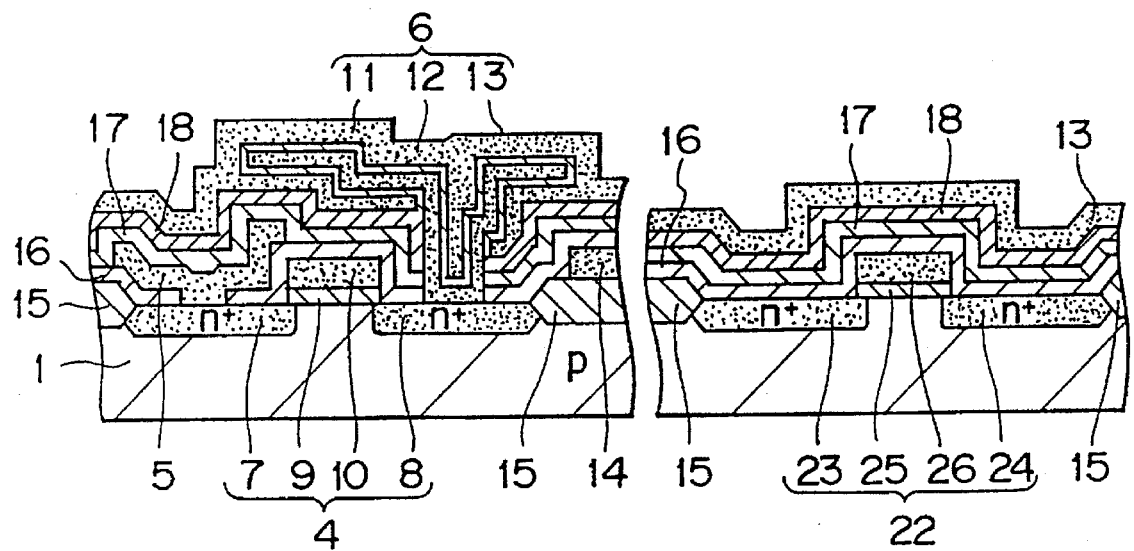
Figure 1G:
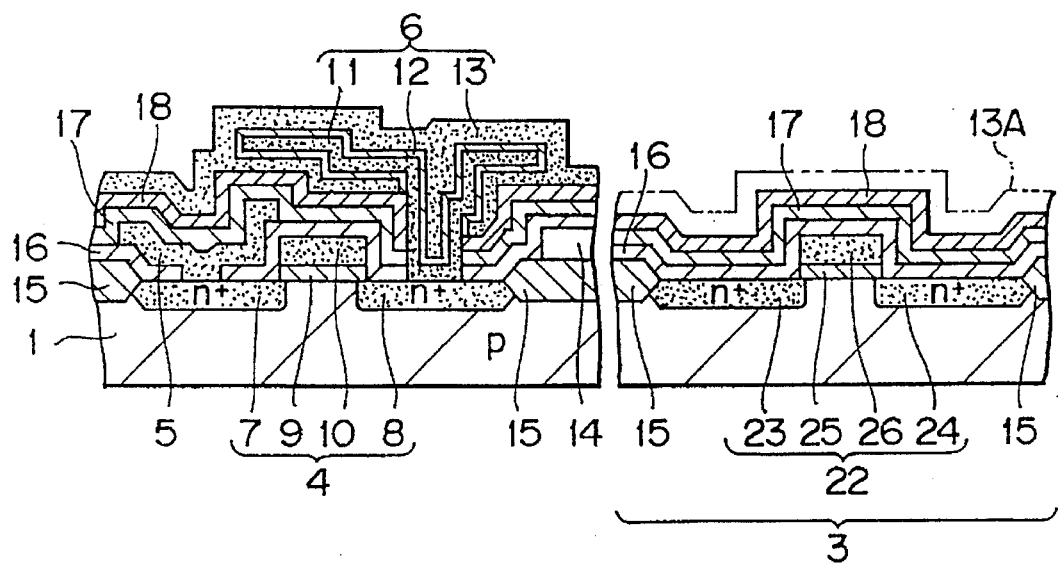
Figure 1H:
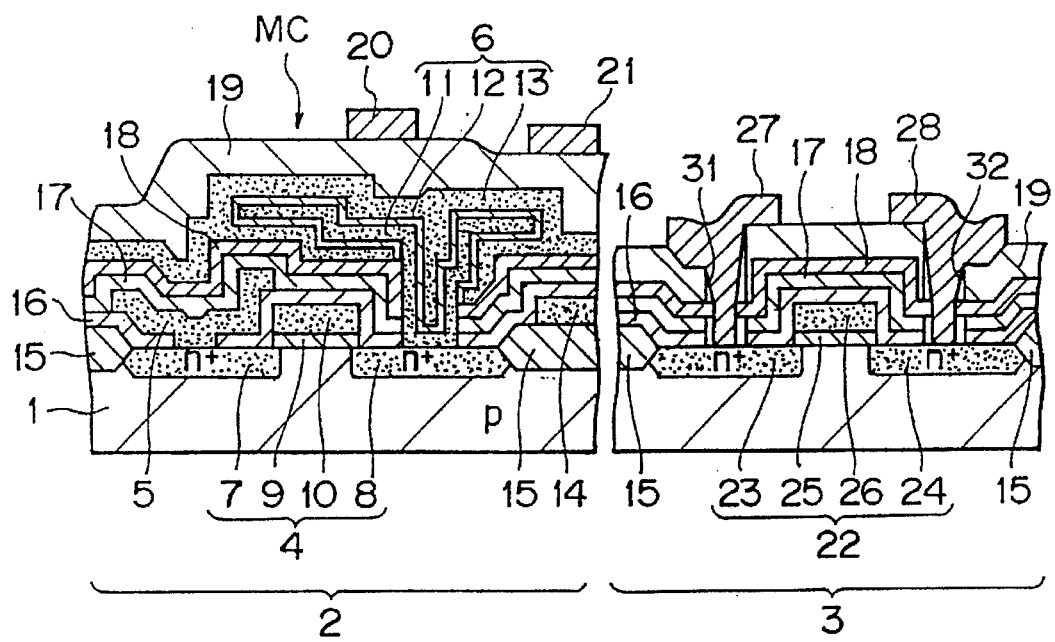

Recently, a DRAM device having a fin structure type (lamination type) capacitor formed above a substrate is provided by shown in FIG. 1H which indicates a sectional view of an important portion in the DRAM device.

In FIG. 1H, reference numeral 1 denotes a p-type silicon substrate as a base substance, 2 denotes a memory cell portion including a plurality of memory cells (DRAM-cells) MC, and 3 denotes a peripheral circuit (portion). Further, in the DRAM-cell portion 2, reference numeral 4 denotes a transfer gate transistor, 5 denotes a bit line, and 6 denotes a fin structure type capacitor. Note, the memory cell MC is constituted by the transfer gate transistor 4 which is constituted by an n-channel type MOS field effect transistor (nMOS FET) and the fin structure type capacitor 6 formed above the transfer gate transistor 4.

In the transfer gate transistor 4 of the nMOS FET, reference numerals 7 and 8 denote $n^+$ diffusion layers, 9 denotes a gate insulation film of silicon dioxide ($SiO_2$), and 10 denotes a word line of polycrystal silicon. Furthermore, the bit line 5 is also made of polycrystal silicon, and connected to one $n^+$ diffusion layer 7 of the transfer gate transistor 4.

The fin structure type capacitor 6 is constituted by a storage electrode 11 of polycrystal silicon, a capacitor insulation film 12 of $SiO_2$ formed over the storage electrode 11, and cell plate 13 of polycrystal silicon. The storage electrode 11 is connected to the other $n^+$ diffusion layer 8 of the transfer gate transistor 4. Furthermore, reference numeral 14 denotes a word line, 15 denotes a field oxide film, 16 and 17 denote $SiO_2$ filmlayers, 18 denotes a silicon nitride ($Si_3N_4$) film layer, 19 denotes a phospho-silicate glass (PSG) layer, and 20 and 21 denote aluminium wiring layers.

In the peripheral circuit 3, reference numeral 22 denotes an nMOS FET, 23 and 24 denote a drain region and source region made of $n^+$ diffusion layers, 25 denotes gate insulation film of $SiO_2$, and 26 denotes a gate electrode of the nMOS FET 22 made of polycrystal silicon. Furthermore, reference numerals 27 and 28 denote aluminium wiring layers, and these aluminium wiring layers are connected to the drain region 23 and the source region 24 of the nMOS FET 22, respectively.

The DRAM device described in the above is produced by the following steps, as shown in FIGS. 1A to 1H.

First, as shown in FIG. 1A, a p-type silicon substrate 1 is prepared, and a transfer gate transistor 4 and an nMOS FET 22 are formed on the substrate 1 after forming a field oxide film 15 therein. Next, as shown in FIG. 1B, a $SiO_2$ film layer 16, a bit line 5, a $SiO_2$ film layer 17, a $Si_3N_4$ film layer 18 and a $SiO_2$ film layer 29 are formed in order. Note, for example, a thickness of the $SiO_2$ film layer 16 is determined to 0.10 μm, a thickness of the bit line 5 is determined to 0.10 μm, a thickness of the $SiO_2$ film layer 17 is determined to 0.05 μm, a thickness of the $Si_3N_4$ film layer 18 is determined to 0.15 μm, and a thickness of the $SiO_2$ film layer 29 is determined to 0.10 μm. Furthermore, as shown in FIG. 1C, a hole 30 having an opening width of 0.50 μm is formed on an $n^+$ diffusion layer 8 such that the hole 30 is passed through the $SiO_2$ film layers 16 and 17, the $Si_3N_4$ film layer 18, and the $SiO_2$ film layer 29.

Next, as shown in FIG. 1D, a storage electrode 11 of polycrystal silicon having a thickness of 0.10 μm is formed. This storage electrode 11 is connected to the $n^+$ diffusion layer 8 through the hole 30. Note, the storage electrode 11 is formed as fin shape portions 11A and 11B on the $SiO_2$ film layer 29. Furthermore, as shown in FIG. 1E, the $SiO_2$ film layer 29 is removed by an etching method using a solution which includes hydrofluoric acid (HF), and then, a capacitor insulation film 12 of $SiO_2$ having, for example, a thickness of 100 Å, is formed over a bare surface of the storage electrode 11 by a thermal oxidation method.

Further, as shown in FIG. 1F, a cell plate 13 of polycrystal silicon having, for example, a thickness of 0.10~0.15 μm is formed over all of the surface. Namely, the polycrystal silicon layer 13 for forming the cell plate is formed over the surfaces in both the DRAM-cell portion 2 and the peripheral circuit 3. Furthermore, as shown in FIG. 1G, a polycrystal silicon layer 13A, which corresponds to the cell plate 13 in the area of the peripheral circuit 3, is removed by an etching method. Namely, in the peripheral circuit 3, the $Si_3N_4$ film layer 18 appears as the top surface.

Finally, as shown in FIG. 1H, a PSG film layer 19 having a thickness of 0.40 μm is formed over all of the surface, and then, contact holes 31 and 32 each having an opening width of 0.50 μm are formed on a drain region 23 and a source region 24 of the nMOS FET 22 in the peripheral circuit 3. Aluminium wirings 27 and 28 are formed through those contact holes 31 and 32 to connect the drain region 23 and the source region 24, and the aluminium wirings 20 and 21 of the the DRAM cell portion 2 are formed at the same time. Note, in this case, the problems, which will be described below with reference to FIGS. 2A to 2H, arise.

FIGS. 2A to 2H are sectional diagrams for explaining in detail the production steps between the steps of FIG. 1G and 1H. Note, FIG. 2A to 2H only indicate a portion of the contact hole 31 (or 32) in the peripheral circuit 3.

Figure 2A:
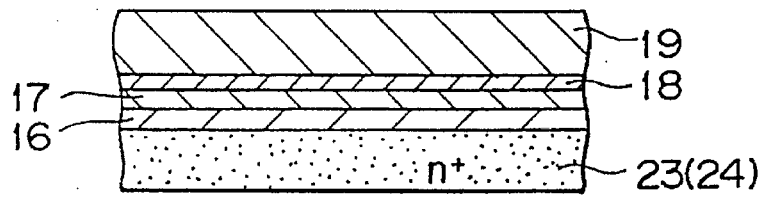
FIGS. 2A to 2H are sectional diagrams for explaining in detail the producing steps between the steps of FIG. 1G and 1H.
Figure 2B:
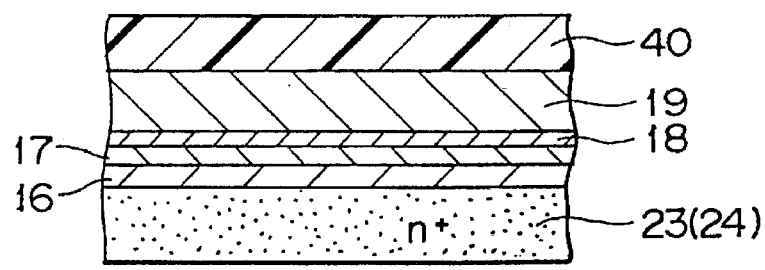
Figure 2C:
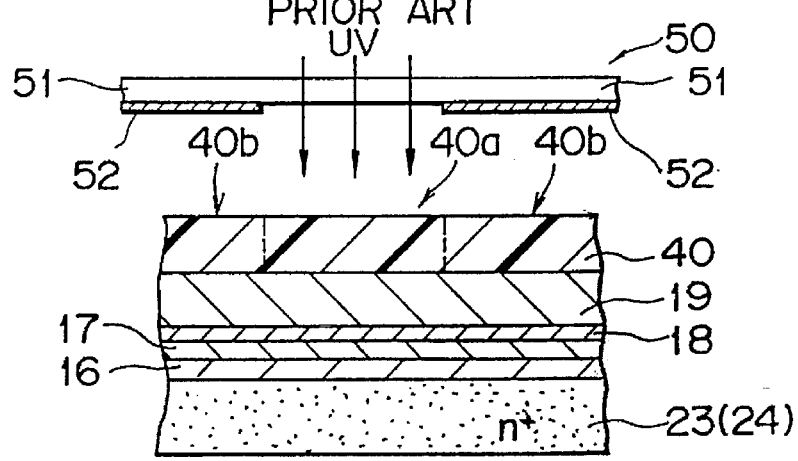
Figure 2D:
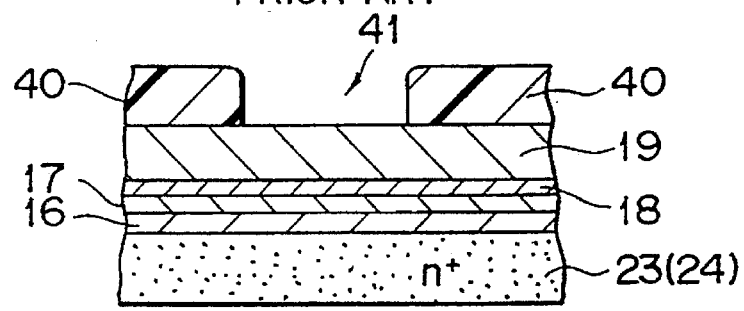

First, as shown in FIGS. 2A and 2B, a PSG layer 19 is formed onto the top surface of the $Si_3N_4$ film layer 18, and a resist layer 40 (for example, a novolak type positive resist) is formed onto the PSG layer 19. Next, as shown in FIG. 2C, the resist layer 40 is exposed as a pattern corresponding to the contact hole 31 by using, for example, ultraviolet light UV and a mask 50 consisting of a quartz glass 51 and specific patterns 52 of chromium formed onto the quartz glass 51. Therefore, a portion 40a in the resist layer 40 corresponding to the contact hole 31 is exposed, and the other portions 40b are not exposed. Furthermore, as shown in FIG. 2D, the exposed portion 40a is removed by using an alkali solution, and then a hole 41 is formed in the resist layer 40.

Figure 2E:
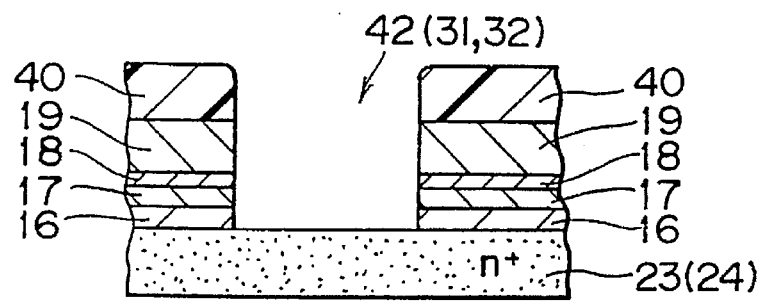
Figure 2F:
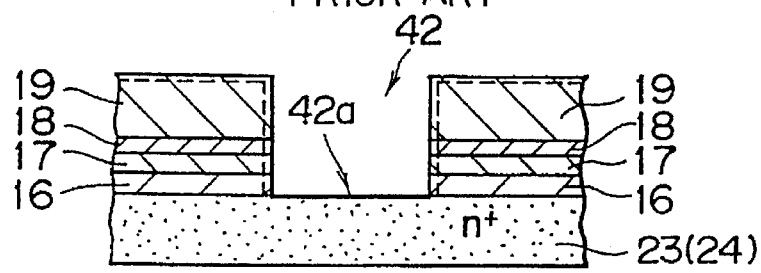

Next, as shown in FIG. 2E, the portions of the PSG layer 19, the $Si_3N_4$ film layer 18, and the $SiO_2$ film layers 17 and 16 corresponding to the hole 41 in the resist layer 40 are removed by an RIE (Reactive Ion Etching) method using $CHF_3/He$, so that a hole portion 42 (31, 32) is formed. Furthermore, as shown in FIG. 2F, the remaining resist layer 40 corresponding to the unexposed portions 40b is removed by using an $O_2$-plasma method or an acid solution (for example, $H_2SO_4/H_2O_2$). Note, in this case, the resist layer 40 can be removed, and the surface 42a of the drain region 23 (or the source region 24) of $n^+$ diffusion layer becomes to be oxidized as $SiO_2$. Namely, the surface 42a of the drain region 23, which may be called a native oxide, is produced at the step of removing the remaining resist layer 40. Note, the surface 42a made of $SiO_2$ is to be a barrier of an electrical connection when connecting the drain region 23 (or the source region 24) to construct the peripheral circuit by using aluminium wiring layer 27 (28), and thus, this insulation surface 42a must be removed.

Figure 2G:
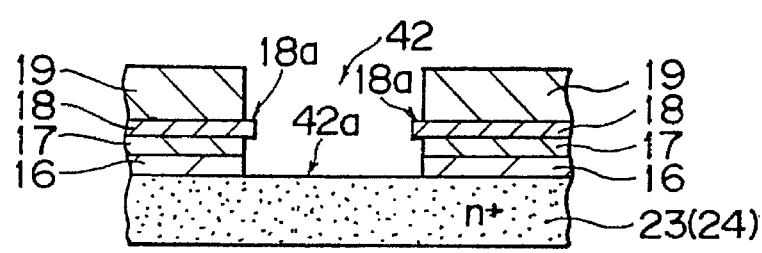
Figure 2H:
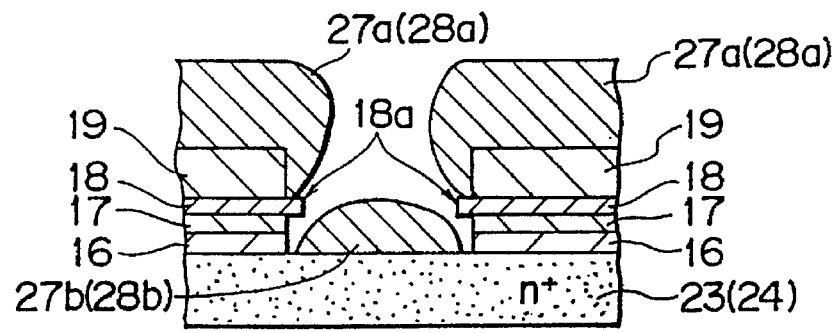

Consequently, as shown in FIG. 2G, the surface 42a of $SiO_2$ is removed by using HF. Note, in this case, the surface of an inside portion of the hole 42 is isotropically removed or etched, and the $Si_3N_4$ film layer 18 is not etched to the same degree of that of the PSG layer 19 or the $SiO_2$ film layers 17 and 16. Namely, as clearly indicated in FIG. 2G, a degree of etching of the $Si_3N_4$ film layer 18 is smaller than that of the PSG layer 19 or the $SiO_2$ film layers 17 and 16, and thus end portions 18a of the $Si_3N_4$ film layer 18, which may be called overhang portions, protrude into the hole 42. Therefore, as shown in FIG. 2H, when sputtering aluminium for forming an aluminium wiring 27 (28), the aluminium wiring 27 may be cut at the end portions 18a of the $Si_3N_4$ film layer 18, and an aluminium 27b (28b) at the bottom portion in the hole 42 can not be connected to aluminium wiring 27a (28a) at the surface portion on the PSG layer 19.

As described above, a conventional DRAM having a fin structure type capacitor 6 can be obtained.

Incidentally, in such a DRAM, it is required that a parasitic capacitance of the bit line 5 be made small to decrease power consumption and stabilize operation. Therefore, it is preferable that the thickness of an insulation layer above the bit line 5, that is, the thickness of the $SiO_2$ film layer 17 and the $Si_3N_4$ film 18 layer are thickly formed.

Neverthless, when the $SiO_2$ film layer 17 and the $Si_3N_4$ film layer 18 are thickly formed, an aspect ratio (a depth of a hole/an opening width) of the contact hole 31 and 32 formed in the peripheral circuit 3 becomes large. Therefore, coverage of the aluminium wiring layers 27 and 28 becomes poor, and the aluminium wiring layers 27 and 28 may be snapped.

Note, in the conventional example as shown in FIGS. 1A to 1H, when assuming the thickness of the $SiO_2$ films 16 and 17 to be 0.10 μm and 0.05 μm, the thickness of the $Si_3N_4$ film layer 18 to be 0.15 μm, the thickness of the PSG film layer 19 to be 0.40 μm, and the opening width of the contact holes 31 and 32 to be 0.50 μm respectively, then the aspect ratio of each of the contact holes 31 and 32 is determined at 1.4 by the following formula.

$$\frac{0.10 + 0.05 + 0.15 + 0.40}{0.5} = 1.4$$

This aspect ratio of 1.4 is a considerably large value, and in the contact holes 31 and 32 having the opening width of 0.50 μm, the aluminium wirings 27 and 28 may be frequently snapped.

As described with reference to FIGS. 1A to 1H, when the $SiO_2$ film layer 17 and the $Si_3N_4$ film layer 18 above the bit line 5 are thickly formed to decrease the power consumption and stabilize the cell operation, the aspect ratios of the contact holes 31 and 32 become large, and an inferior wiring coverage step is caused.

Conversely, when the $SiO_2$ film layer 17 and the $Si_3N_4$ film layer 18 above the bit line 5 are thinly formed, the aspect ratios of the contact holes 31 and 32 can be small, but the parasitic capacitance of the bit line 5 becomes large, so that the decrease of the power consumption and stabilization of the operation can not be realized. That is, in the conventional method of producing the semiconductor memory device as shown in FIGS. 1A to 1H, one requirement of decreasing the power consumption and stabilizing the operation of the cell by decreasing the parasitic capacitance of the bit line 5, and the other requirement of improving the step coverage of the wiring by decreasing the aspect ratios of the contact holes 31 and 32 can not be simultaneously satisfied. Note, in this case, it can be considered to decrease the aspect ratio by enlarging the opening width of the contact hole. However, in enlarging the opening width of the contact hole the sizes of the drain region 23 and the source region 24 of the nMOS FET 22 must be enlarged so that development of the mass storage semiconductor memory device is prevented. Furthermore, it can be also considered to decrease the aspect ratio by decreasing the thickness of the PSG film layer 19. However, in decreasing the thickness of the PSG film layer 19, the parasitic capacitances of the aluminium wiring layers 20, 21, 27, and 28 are increased so that high speed operation cannot be realized and the insulation characteristic is decreased.

Additionally, as described above with reference to FIGS. 2A to 2H, when removing the surface 42a of $SiO_2$ in the hole 42, a degree of etching of the $Si_3N_4$ film layer 18 is quite different from that of the $SiO_2$ film layers 17 and 16, and thus end portions 18a of the $Si_3N_4$ film layer 18 protrude into the hole 42. Therefore, the aluminium wiring 27 (28) may be cut at the end portions 18a of the $Si_3N_4$ film layer 18.

Next, a principle of the present invention will be explained.

In a method of producing a semiconductor memory device according to the present invention, with reference to FIGS. 3A to 7, first, a first insulation film layer 16 is formed onto a first semiconductor element 4 and a second semiconductor element 22. Note, the first semiconductor element 4 is used to constitute a memory cell MC formed on a semiconductor substrate 1, and the second semiconductor element 22 is used to constitute a peripheral circuit 3 except the memory cell MC formed on the semiconductor substrate 1. Next, a first conductive layer 5 is formed onto the first insulation film layer 16, and the first conductive layer 5 is patterned in the shape of a bit line and is electrically connected to the first semiconductor element 4. Furthermore, a second insulation film layer 18 extending onto the first insulation film layer 16 and the first conductive layer 5 is formed.

Next, a second conductive layer 13 is formed onto the second insulation film layer 18. Note, the second conductive layer 13 is used as a cell plate of a capacitor element 6 in a memory cell portion 2. Furthermore, at least the second conductive layer 13 (13A) and the second insulation film layer 18 formed on the second semiconductor element 22 are removed in order. Additionally, contact holes 31, 32 are formed. Note, the contact holes 31, 32 are formed to pass through at least the first insulation film layer 16 without passing through the second insulation film layer 18, and are formed to reach to a surface of the second semiconductor element 22.

In the present invention, at least the second insulation film layer 18A formed above the second semiconductor element 22 in all the second insulation film layer 18 is removed, and the opening hole passing through the first insulation film layer 16 and reaching to a surface of the second semiconductor element 22 can be decreased, or aspect ratios of contact holes 31, 32 in peripheral circuit 3 can be small.

Furthermore, the aspect ratios of the contact holes 31, 32 in the peripheral circuit 3 are not affected by the thickness of the second insulation film layer 18 for the same reasons, and the thickness of a memory cell portion 2, or the thickness of the second insulation film layer 18 at the memory cell portion 2 can be independently thickened so that a parasitic capacitance of the bit line 5 can be decreased.

Additionally, when removing the surface 42a of $SiO_2$ in the contact holes 31, 32, protruded portions in the contact holes 31, 32 are not produced as the second insulation film layer 18 is already removed. Namely, the shape of the contact holes 31, 32 are improved, and thus aluminium wiring 27 (28) is not cut and an electrical connection of the aluminium wiring 27 (28) is improved.

Below, the preferred embodiments of a DRAM device and a producing method thereof according to the present invention will be explained with reference to FIGS. 3A to 7.

FIGS. 3A to 3H are sectional diagrams for explaining a method of producing a DRAM of an embodiment according to the present invention. Note, in FIGS. 3A to 3H, reference numerals corresponding to those shown in FIGS. 1A to 1H indicate the same portions.

In the present embodiment, firstly, as shown in FIGS. 3A to 3F, the same steps as shown in FIGS. 1A to 1F are carried out.

Figure 3A:
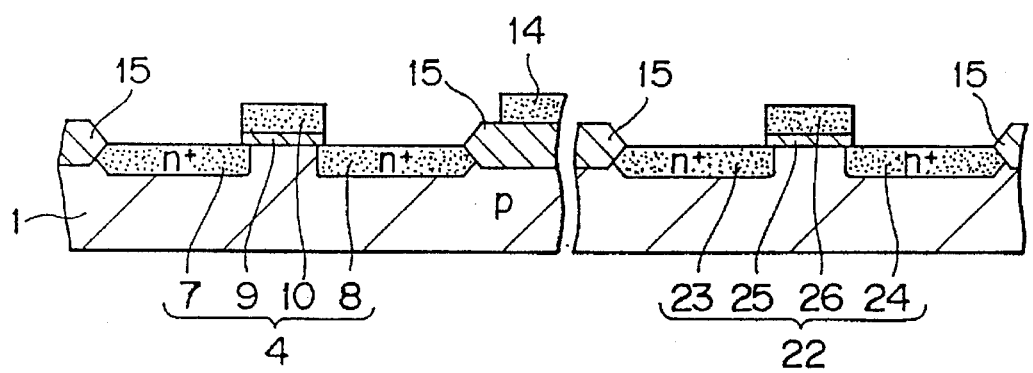
FIGS. 3A to 3H are sectional diagrams for explaining a method of production a DRAM of an embodiment according to the present invention.
Figure 3B:
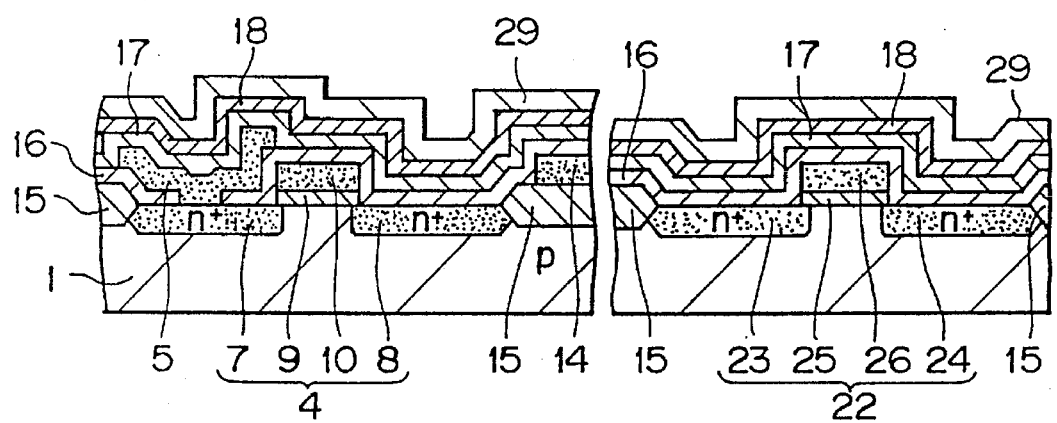
Figure 3C:
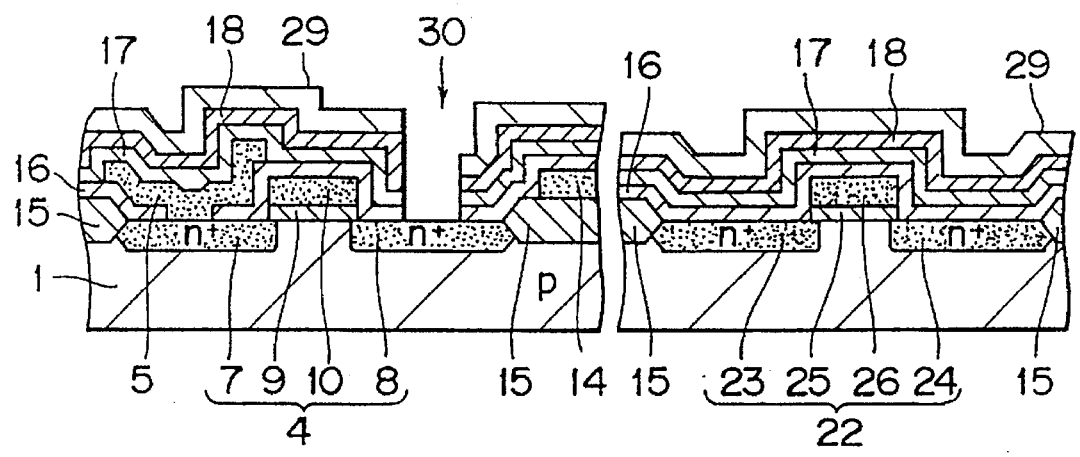

Namely, first, as shown in FIG. 3A, a p-type silicon substrate 1 is prepared, and a transfer gate transistor 4 and an nMOS FET 22 are formed on the substrate 1 after forming a field oxide film 15 therein. Next, as shown in FIG. 3B, a $SiO_2$ film layer 16, a bit line 5, a $SiO_2$ film layer 17, a $Si_3N_4$ film layer 18 and a $SiO_2$ film layer 29 are orderly formed. Note, for example, a thickness of the $SiO_2$ film layer 16 is determined to 0.10 μm, a thickness of the bit line 5 is determined to 0.10 μm, a thickness of the $SiO_2$ film layer 17 is determined to 0.05 μm, a thickness of the $Si_3N_4$ film layer 18 is determined to 0.15 μm, and a thickness of the $SiO_2$ film layer 29 is determined to 0.10 μm. Note, in the present embodiment, the $SiO_2$ film layer 16 corresponds to the first insulation film layer, and the $Si_3N_4$ film layer 18 and the $SiO_2$ film layer 17 correspond to the second and third insulation film layer. Furthermore, as shown in FIG. 3C, a hole 30 having an opening width of 0.50 μm is formed on an $n^+$ diffusion layer 8 such that the hole 30 is passed through the $SiO_2$ film layers 16 and 17, the $Si_3N_4$ film layer 18, and the $SiO_2$ film layer 29.

Figure 3D:
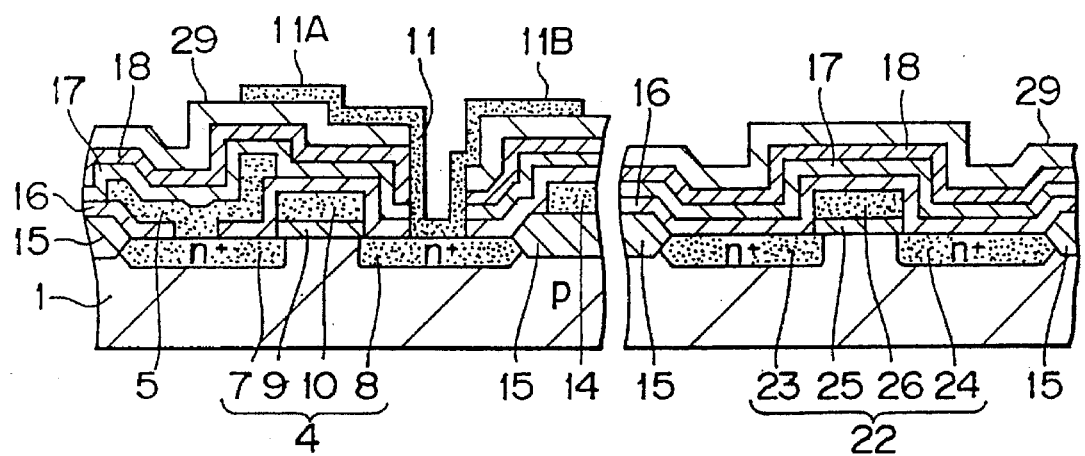

Next, as shown in FIG. 3D, a storage electrode 11 of polycrystal silicon having a thickness of 0.10 μm is formed.

Figure 3E:
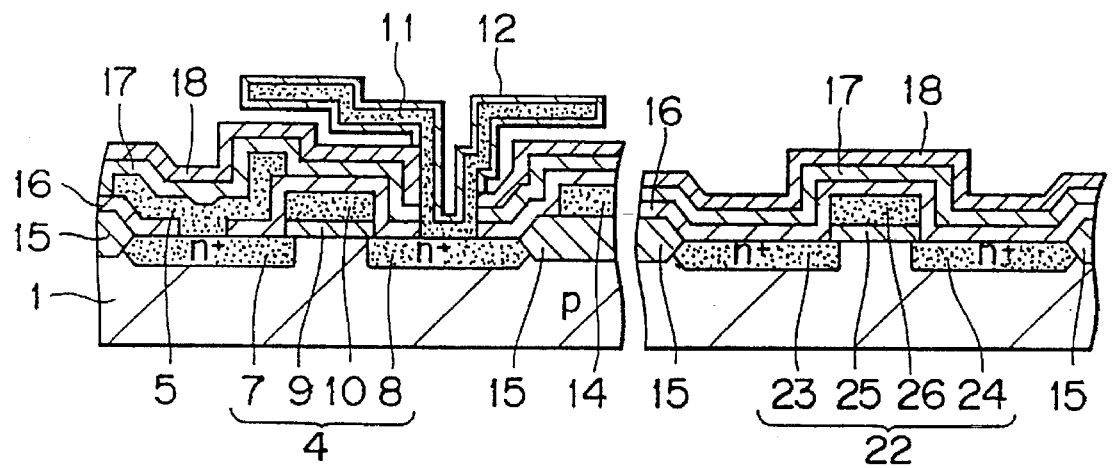

This storage electrode 11 is connected to the n⁺ diffusion layer 8 through the hole 30. Note, the storage electrode 11 is shaped as fin portions 11A and 11B formed on the $SiO_2$ film 29. Furthermore, as shown in FIG. 3E, the $SiO_2$ film layer 29 is removed by an etching method using a solution which includes hydrofluoric acid (HF), and then a capacitor insulation film 12 of $SiO_2$ having, for example, a thickness of 100 Å, is formed over a bare surface of the storage electrode 11 by a thermal oxidation method.

Figure 3F:
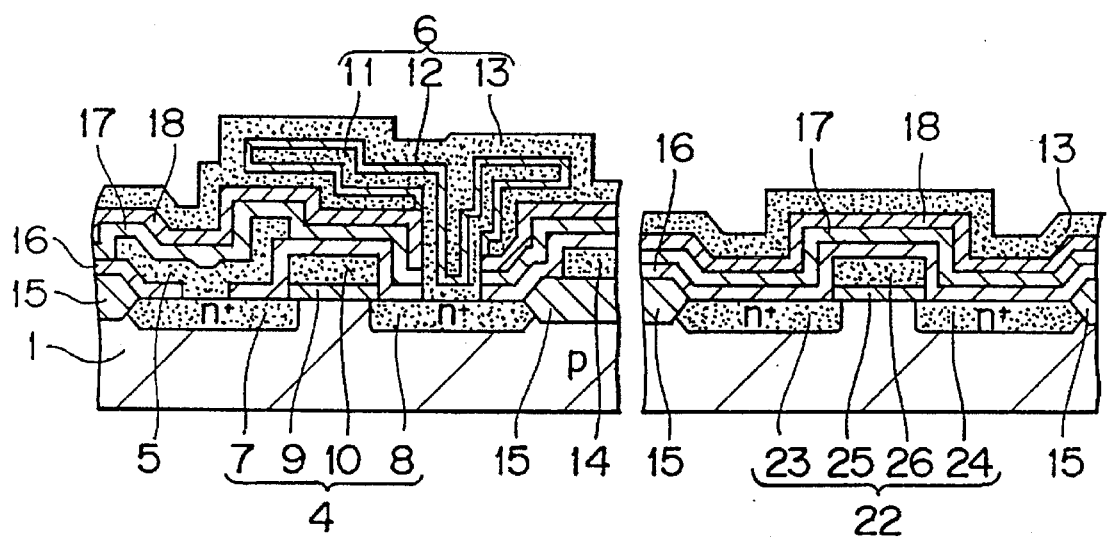
Figure 3G:
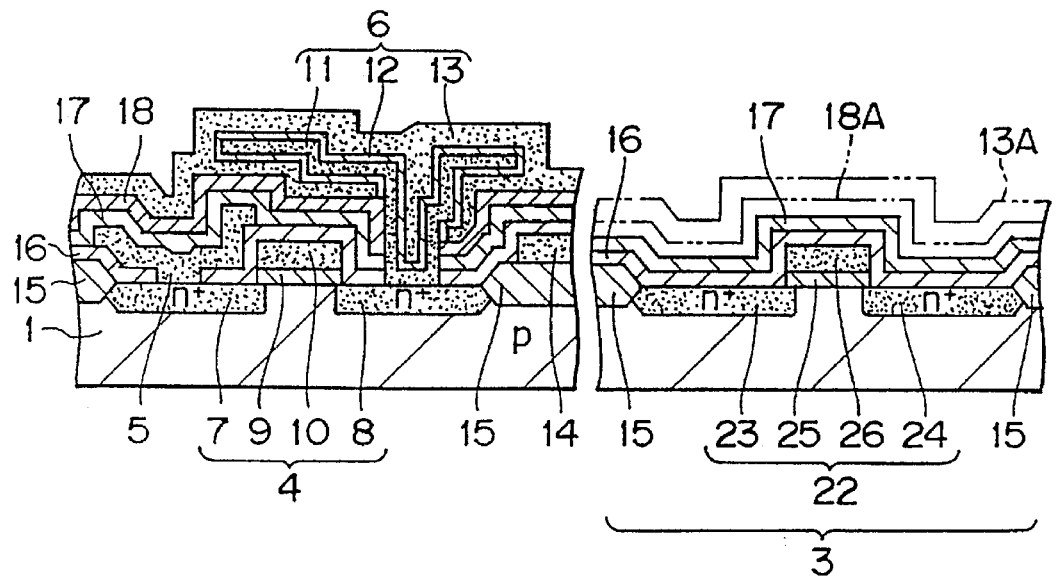

Further, as shown in FIG. 3F, a cell plate 13 of polycrystal silicon having, for example, a thickness of 0.10~0.15 µm is formed over all of the surface. The above steps until this are the same processes of the conventional example as shown in FIGS. 1A to 1F. Note, in the present embodiment, a mixed gas made of sulfur hexafluoride ($SF_6$) and freon type gas, for example, freon (carbon tetrafluoride: $CF_4$), is used, and as shown in FIG. 3G, a polycrystal silicon layer 13A and a $Si_3N_4$ film layer 18A, which correspond to the area of the peripheral circuit 3 in the cell plate 13 and the $Si_3N_4$ film layer 18 formed all over the surface, are removed by an etching method. Namely, in the peripheral circuit 3, both polycrystal silicon layer 13A and the $Si_3N_4$ film layer 18 are removed, and the $SiO_2$ insulation film layer 17 appears as the top surface.

Figure 3H:
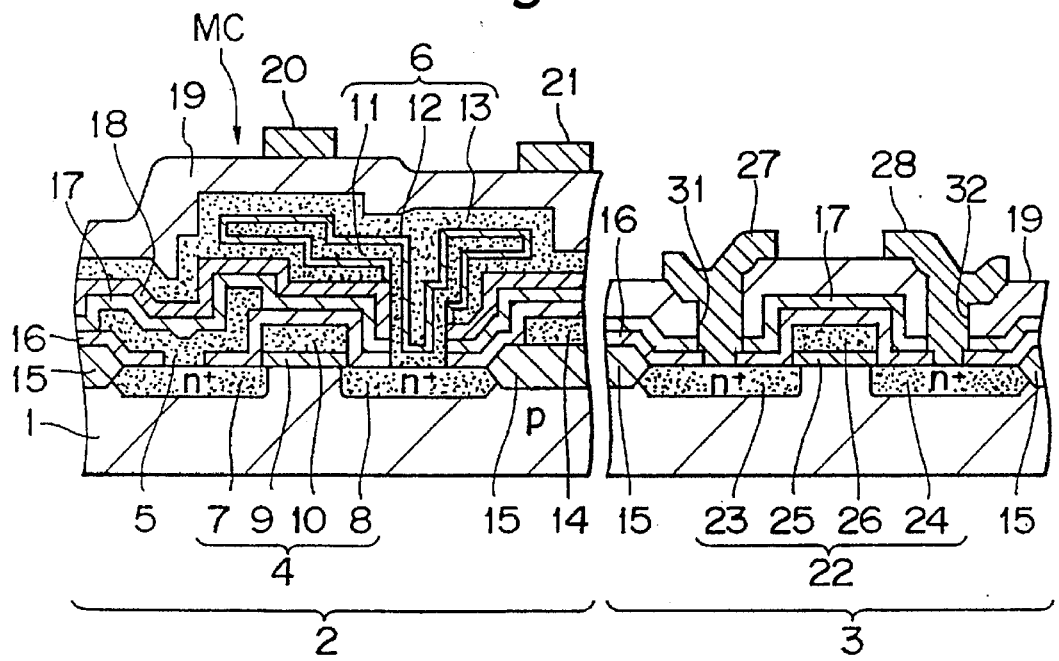

Finally, as shown in FIG. 3H, a PSG film layer 19 having a thickness of 0.40 µm is formed over all of the surface, and then, contact holes 31 and 32 are formed on a drain region 23 and a source region 24 of the nMOS FET 22 in the peripheral circuit 3. Aluminium wirings 27 and 28 are formed through those contact holes 31 and 32 to connect the drain region 23 and the source region 24, and the aluminium wirings 20 and 21 of the the DRAM cell portion 2 are formed at the same time.

Figure 4A:
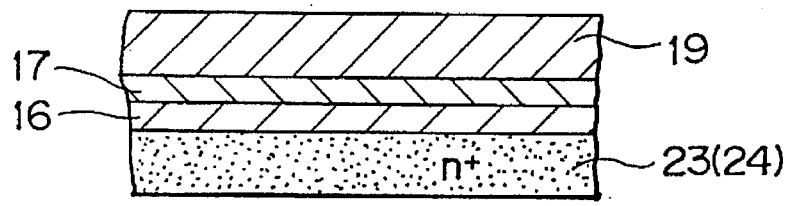
FIGS. 4A to 4H are sectional diagrams for explaining in detail the production steps between the steps of FIG. 3G and 3H.
Figure 4B:
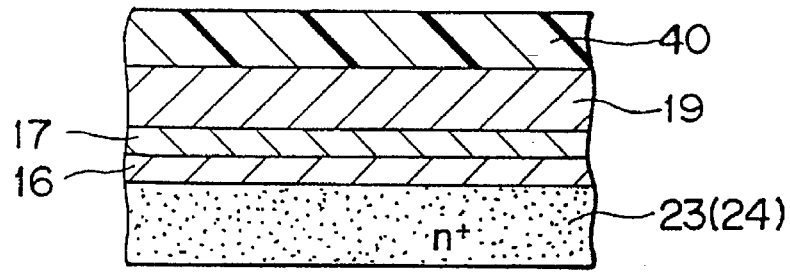
Figure 4C:
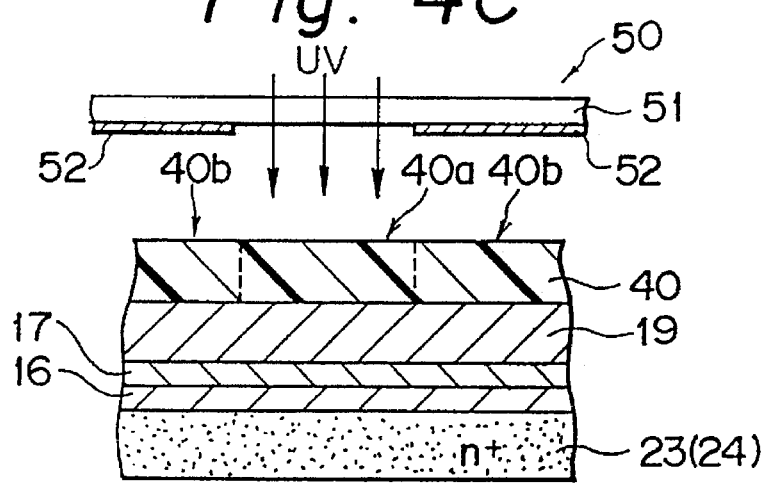
Figure 4D:
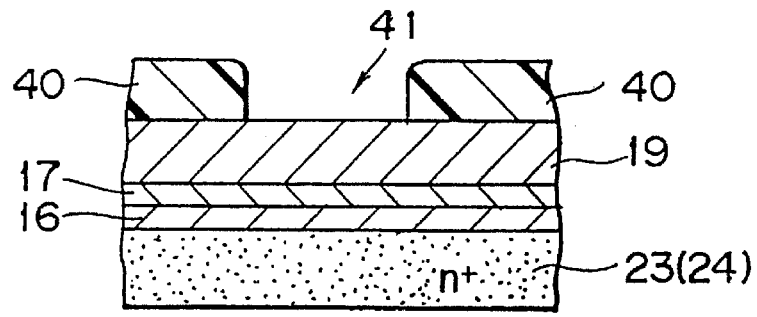
Figure 4E:
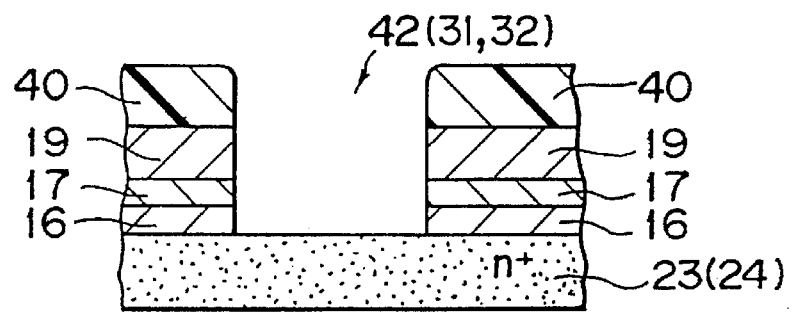
Figure 4F:
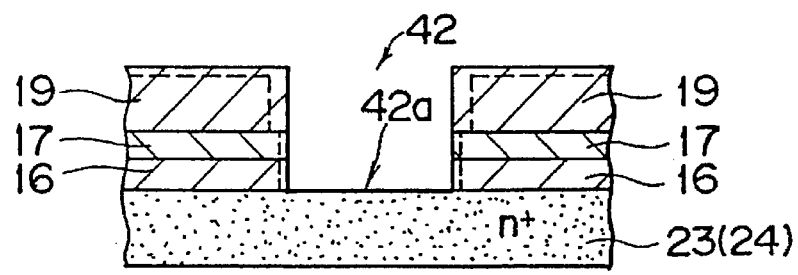
Figure 4G:
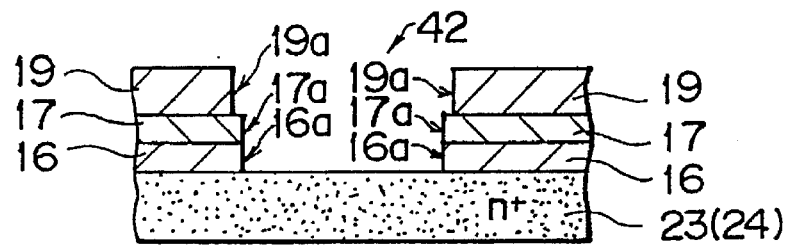

FIGS. 4A to 4H are sectional diagrams for explaining in detail the production steps between the steps of FIGS. 3G and 3H. Note, FIG. 4A to 4H only indicate a portion of the contact hole 31 (or 32) in the peripheral circuit 3. Note also, in comparison with the prior example shown in FIG. 2G, the embodiment as shown in FIG. 4G does not include the $Si_3N_4$ film layer 18 in the peripheral circuit 3.

First, as shown in FIGS. 4A and 4B, a PSG layer 19 is formed onto the top surface of the $SiO_2$ film layers 17, and a resist layer 40 (for example, a novolak type positive resist) is formed onto the PSG layer 19. Next, as shown in FIG. 4C, the resist layer 40 is exposed as a pattren corresponding to the contact hole 31 by using, for example, ultraviolet light UV and a mask 50 consisting of a quartz glass 51 and specific patterns 52 of chromium formed onto the quartz glass 51. Therefore, a portion 40a in the resist layer 40 corresponding to the contact hole 31 is exposed, and the other portions 40b are not exposed. Furthermore, as shown in FIG. 4D, the exposed portion 40a is removed by using an alkali solution, and then a hole 41 is formed in the resist layer 40.

Next, as shown in FIG. 4E, the portions of the PSG layer 19 and the $SiO_2$ film layers 17 and 16 corresponding to the hole 41 in the resist layer 40 are removed by an RIE (Reactive Ion Etching) method using $CHF_3$/He, so that a hole portion 42 (31, 32) is formed. Furthermore, as shown in FIG. 4F, the remaining resist layer 40 corresponding to the unexposed portions 40b is removed by using an $O_2$-plasma method or an acid solution (for example, $H_2SO_4/H_2O_2$). Note, in this case, the resist layer 40 can be removed, and the surface 42a of the drain region 23 (or the source region 24) of n⁺ diffusion layer becomes oxidized as $SiO_2$. Namely, the surface 42a of the drain region 23, which may be called a native oxide, is produced by the step of removing the remaining resist layer 40. Note, the surface 42a made of $SiO_2$ is to be a barrier of an electrical connection when connecting the drain region 23 (or the source region 24) to construct the peripheral circuit by using aluminium wiring layer 27 (28), and thus, this insulation surface 42a must be removed.

Figure 4H:
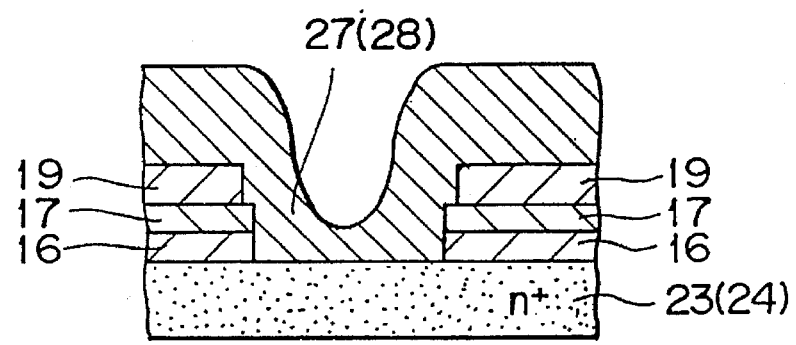

Consequently, as shown in FIG. 4G, the surface 42a made of $SiO_2$ is removed by using HF. Note, in this case, the surface of an inside portion of the hole 42 is isotropically removed or etched, but the $Si_3N_4$ film layer 18 is already removed and the hole 42 is constituted by the PSG layer 19 and the $SiO_2$ film layers 17 and 16. Note, a degree of etching of the PSG layer 19 is a little larger than (or almost the same as) that of the $SiO_2$ film layers 17 and 16, and thus the overhang portions are not produced. Namely, the opening width (19a) of the PSG layer 19 is almost equal to (or a little larger than) that (16a, 17a) of the $SiO_2$ film layers 17 and 16, and no end portions protrude into the hole 42. That is, the shape of the hole 42 (the contact hole 31, 32) is improved. Therefore, as shown in FIG. 4H, when sputtering aluminium for forming an aluminium wiring 27 (28), the aluminium wiring 27 is not cut and is securely connected to the surface of the drain region 23 of the n⁺ diffusion layer.

Therefore, a DRAM having a fin structure type capacitor 6 formed above the p-type silicon substrate 1 can be obtained.

In the present embodiment, a parasitic capacitance of the bit line 5 can be decreased, the power consumption can be decreased and the operation of the cell can be stabilized, because the thicknesses of the $SiO_2$ film layer 17 and the $Si_3N_4$ film layer 18 are determined to 0.05 µm and 0.15 µm and the total thickness of the film layers is determined to 0.20 µm.

Furthermore, in the present embodiment, as shown in FIG. 3G, the $Si_3N_4$ film layer 18A corresponds to the area of the peripheral circuit 3 in the $Si_{3N4}$ film layer 18 formed over all of the surface, does not exist, so that the aspect ratios of the contact holes 31, 32 can be decreased and the coverage of the aluminium wiring layers 27 and 28 can be improved. Additionally, as shown in FIGS. 4G and 4H, the hole 42 is constituted by the PSG layer 19 and the $SiO_2$ film layers 17, 16 without including the $Si_3N_4$ film layer 18, the shape of the contact holes 31, 32 is improved, and thus the aluminium wirings 27, 28 are not cut and are securely connected to the surface of the drain region 23.

Concretely, in the present embodiment, the thicknesses of the $SiO_2$ film layers 16 and 17 are determined to 0.10 µm and 0.05 µm, the thickness of the PSG film layer 19 is determined to 0.40 µm, and the opening widths of the contact holes 31, 32 are determined to 0.50 µm, which are the same values as the conventional ones as shown in FIGS. 1A to 1H, and the aspect ratios of the contact holes 31, 32 can be determined at 1.1.

$$\frac{0.10 + 0.05 + 0.40}{0.5} = 1.1$$

This aspect ratio of 1.1 is smaller than that of the conventional one as shown in FIGS. 1A to 1H, and the coverage of the aluminium wiring layers 27 and 28 can be improved.

As described above, according to the present embodiment, one requirement of decreasing the power consumption and stabilizing the operation of the cell by decreasing the parasitic capacitance of the bit line 5, and the other requirement of improving the step coverage of the wiring by decreasing the aspect ratios of the contact holes 31 and 32 can be simultaneously satisfied.

Furthermore, in the present embodiment, a process of removing the $Si_3N_4$ film layer 18A and a process of removing the cell plate 13A are carried out by the same process, and thus an additional process is not necessary in comparison with the conventional example as shown in FIGS. 1A to 1H.

Note, the above described embodiment is explained for a case when the thickness of the $Si_3N_4$ film layer 18 is determined to 0.15 μm, but the aspect ratios of the contact holes 31 and 32 at the peripheral circuit 3 are not influenced by the thickness of the $Si_3N_4$ film layer 18. Consequently, the thickness of the $Si_3N_4$ film layer 18 can be determined more thickly than 0.15 μm to decrease the parasitic capacitance of the bit line 5, so that the consumption power can be further decreased and the operation of the cell can be more stabilized.

Additionally, in the above embodiment, the first insulation film layer of the $SiO_2$ film layer 16, the second insulation film layer of the $SiO_2$ film 17 and the $Si_3N_4$ film 18, are described, but the $SiO_2$ film layer 17 is not always required. When omitting the $SiO_2$ film layer 17, the aspect ratio can be further decreased. Namely, in the above example, the aspect ratio can be determined at 1.0.

$$\frac{0.10 + 0.40}{0.5} = 1.0$$

Figure 5A:
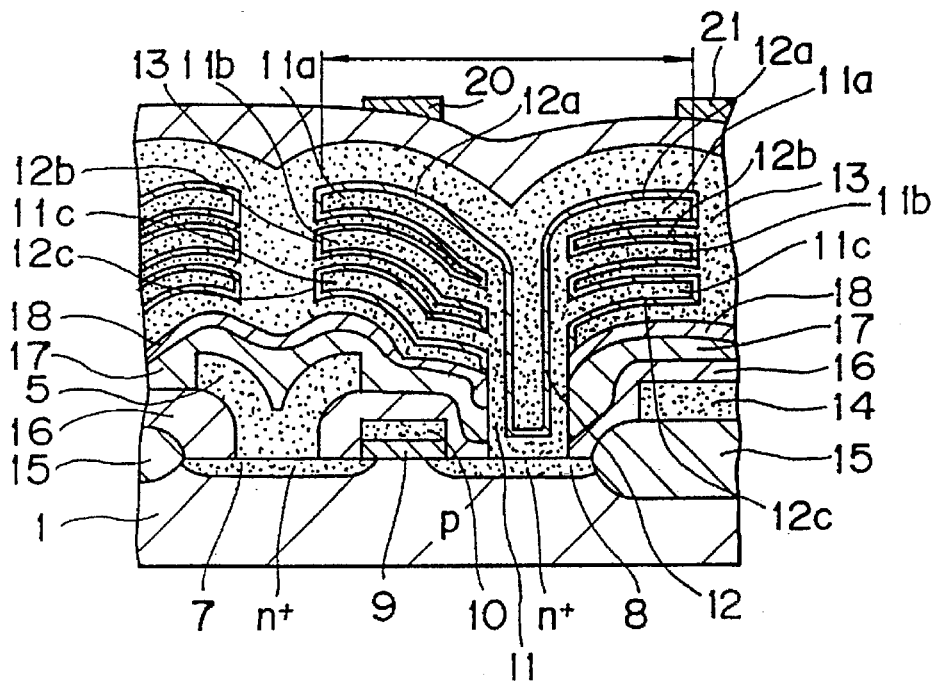
FIGS. 5A to 5C are diagrams indicating another embodiment of the DRAM according to the present invention.
Figure 5B:
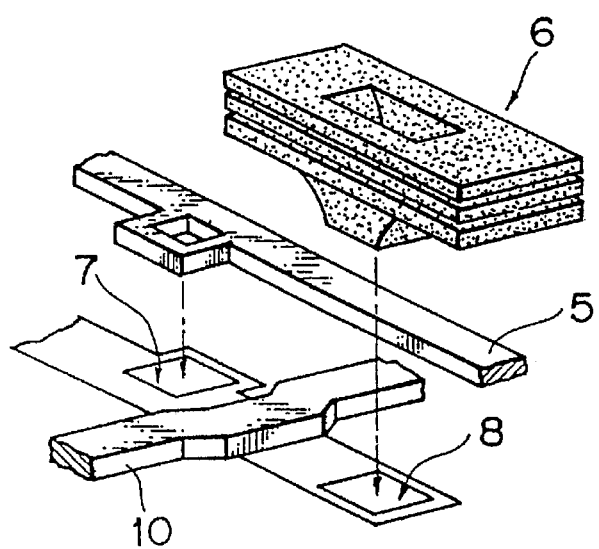
Figure 5C:
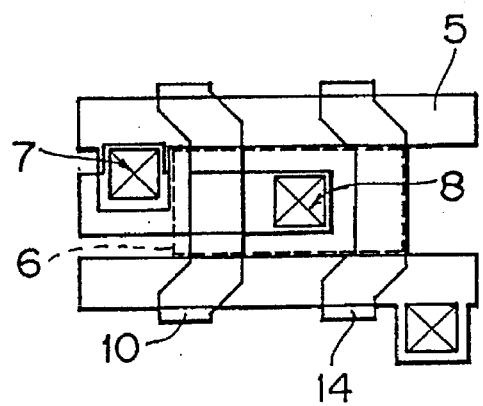

FIGS. 5A to 5C are diagrams indicating another embodiment of the DRAM according to the present invention.

As shown in FIG. 5A, in this embodiment, a storage electrode 11 is constituted by three stratiform polycrystal silicon layers (fin portions) 11a, 11b, and 11c. Note, capacitor insulation films 12a, 12b, and 12c made of $SiO_2$ are formed over the surfaces of these fin portions 11a, 11b, and 11c. Therefore, a capacitance of the capacitor 6, which is constituted by the storage electrode 11 (11a, 11b, and 11c), the capacitor insulation film 12 (12a, 12b, and 12c) and the cell plate 13, can be increased, and thus a large capacitor area can be obtained. As shown in FIGS. 5B and 5C, bit lines are formed before the storage capacitor, so other patterning after the storage electrode 11 is not necessary, and thus good scalability can be obtained. Furthermore, bit line to bit line coupling can be reduced because cell plate 13 acts as a shield plate. Note, in this embodiment, a $Si_3N_4$ film layer 18 is used to form the fin structure type capacitor (6) above the transfer gate transistor (4). Additionally, these merits are also provided in the DRAM device as shown in FIG. 3H.

Figure 6:
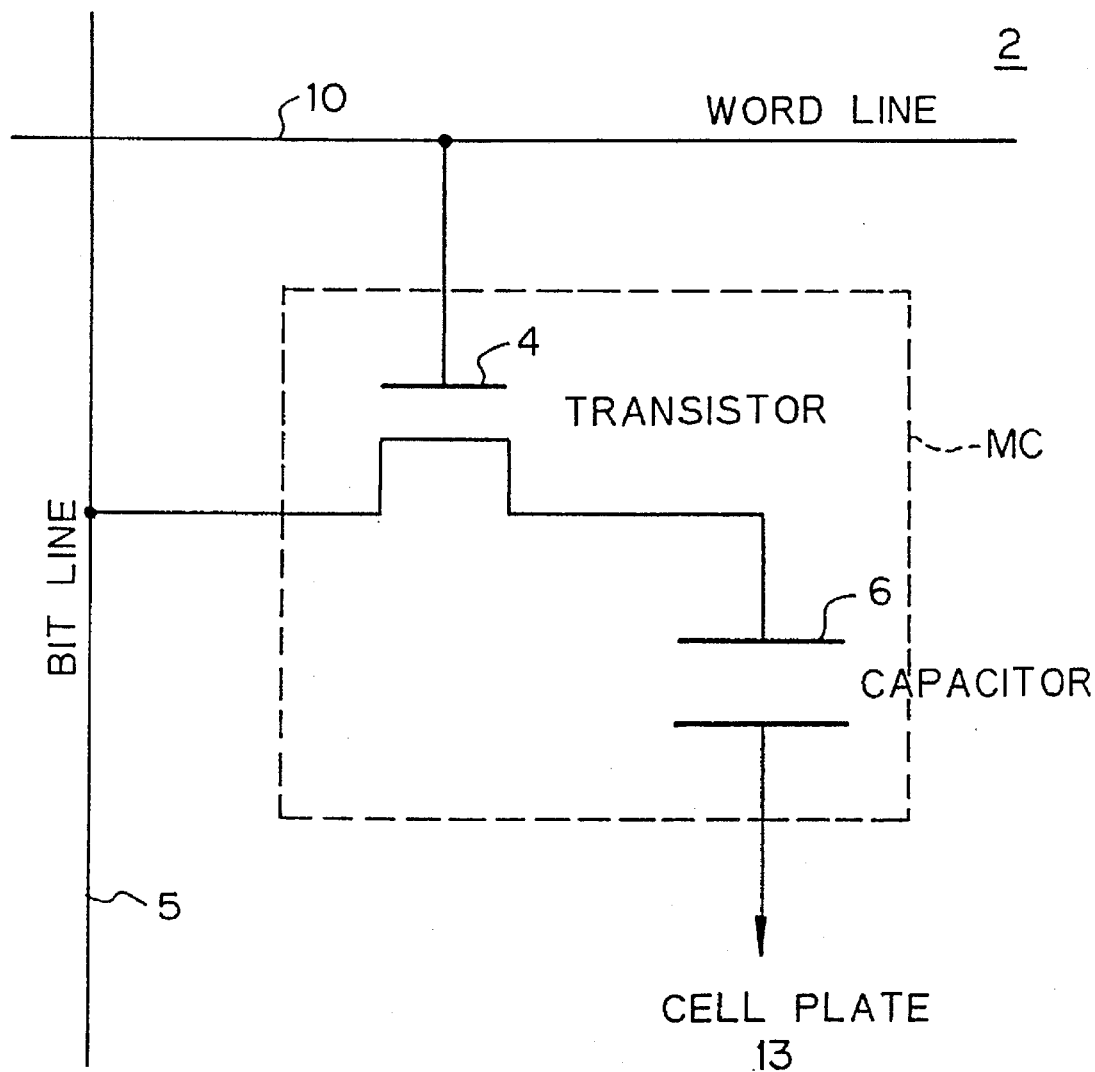
FIG. 6 is a circuit diagram indicating a typical memory cell of the DRAM applying the present invention.

FIG. 6 is a circuit diagram indicating a typical memory cell of the DRAM applying the present invention. In the above descriptions, a memory cell portion 2 comprises a plurality of bit lines 5, word lines 10, and memory cells MC provided at the cross-connection portions between each of the bit lines 5 and the word lines 10. The memory cell MC is constituted by a transfer gate transistor 4 and a capacitor 6. A drain (source) of the transistor 4 is connected to a bit line 5, a gate of the transistor 4 is connected to a word line 10, and a source (drain) of the transistor 4 is connected to one end of the capacitor 6. The other end of the capacitor 6 is constituted by a cell plate 13 applied a cell plate bias voltage. Note, the capacitor 6 is constituted as a fin structure type capacitor formed above the transfer gate transistor 4, as shown in FIGS. 3H and 5A.

Figure 7:
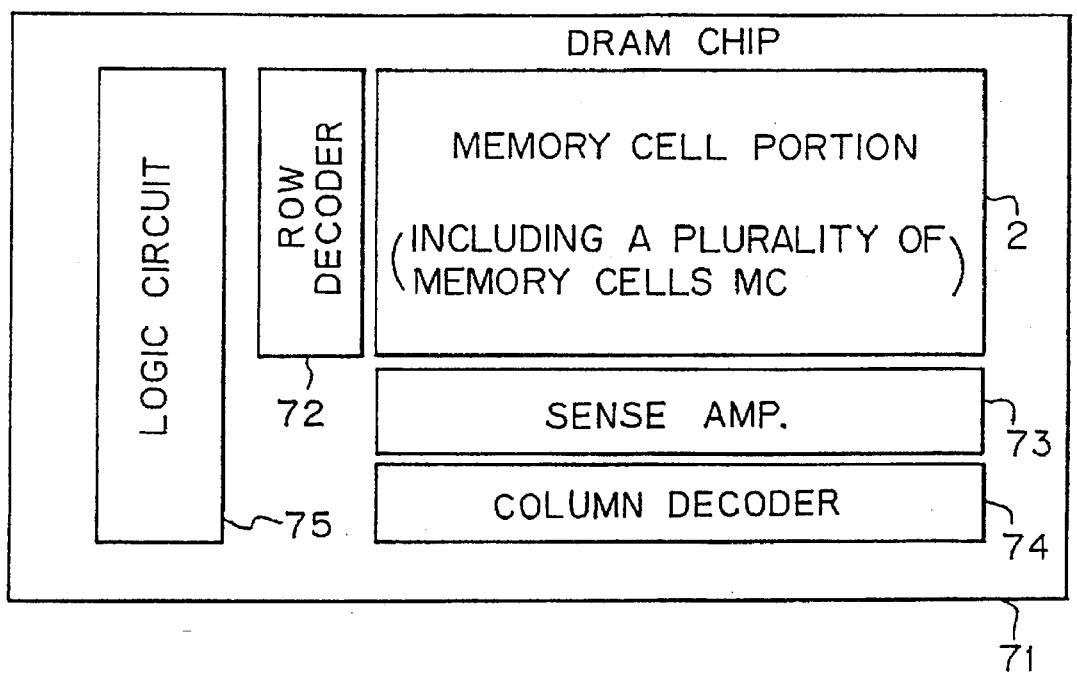
FIG. 7 is a block diagram indicating a typical DRAM chip applying the present invention.

FIG. 7 is a block diagram indicating a typical DRAM chip applying the present invention. As shown in FIG. 7, in a DRAM chip 71, a memory cell portion 2 is constituted by a plurality of bit lines 5, word lines 10, and memory cells MC, and a peripheral circuit is constituted by a row decoder 72, a sense amplifier 73, a column decoder 74, and a logic circuit 75. Note, the peripheral circuits of the row decoder 72 and the like is constructed by a plurality of transistors 22 in the peripheral circuit 3, as shown in FIG. 3H.

As described above, in the present invention, a polycrystal silicon layer is used to a cell plate of a capacitor in a memory cell portion, and a $Si_3N_4$ film layer is used to form the capacitor above a transfer gate transistor in a memory cell. Both a polycrystal silicon layer and $Si_3N_4$ film layer formed above a transistor of a peripheral circuit are removed simultaneously by an etching method. Therefore, an aspect ratio and a shape of a contact hole in the peripheral circuit are improved, and thus the step coverage of the wiring in the peripheral circuit can be improved. Namely, a coverage of the aluminium wiring layer improves, and the aluminium wiring layer is not snapped.

Many widely differing embodiments of the present invention may be constructed without departing from the spirit and scope of the present invention, and it should be understood that the present invention is not limited to the specific embodiments described in this specification, except as defined in the appended claims.

I claim:

1. A method of producing a semiconductor memory device, wherein said method comprises:

a step of forming a first insulation film layer onto a first semiconductor element and a second semiconductor element, said first semiconductor element being used to constitute a memory cell formed on a semiconductor substrate, and said second semiconductor element being used to constitute a peripheral circuit except said memory cell formed on said semiconductor substrate;

steps of forming a first conductive layer onto the first insulation layer, and forming a bit line by patterning said first conductive layer;

a step of forming a second insulation layer over said bit line;

a step of forming a capacitor element composed of a storage electrode, a capacitor insulation film and a cell plate over said second insulation layer, said cell plate being constituted by a second conduction layer;

a step of removing said second conductive layer, said capacitor insulation film and at least a part of said second insulation layer formed above said second semiconductor element; and a step of making a contact hole passing through at least said first insulation layer without passing through said removed part of said second insulation layer, and reaching to a surface of said second semiconductor element.

2. A method of producing a semiconductor memory device as claimed in claim 1, wherein said second insulation layer is used to form said capacitor element above said first semiconductor element.

3. A method of producing a semiconductor memory device as claimed in claim 1, wherein said second conductive layer is constituted by polycrystal silicon layer, said second insulation layer is constituted by a $Si_3N_4$ film layer, and said insulation film layers except the second insulation layer are constituted by $SiO_2$ film layers.

4. A method of producing a semiconductor memory device as claimed in claim 3, wherein said second conductive layer of polycrystal silicon and said second insulation layer of $Si_3N_4$ formed on said second semiconductor element are removed by an etching method using mixed gas.

5. A method of producing a semiconductor memory device as claimed in claim 4, wherein said mixed gas is made of sulfur hexafluoride and freon gas.

6. A method of producing a semiconductor memory device as claimed in claim 1, wherein said method further comprises a step of forming a third insulation film layer between said first insulation film layer and said second insulation film layer.

7. A method of producing a semiconductor memory device as claimed in claim 6, wherein said method further comprises:

a step of forming a fourth insulation film layer onto said second insulation film layer, said fourth insulation film layer being made of different material from said second insulation film layer;

a step of forming a hole passing through said fourth, second, third, and first insulation film layers, and reaching to a surface of said first semiconductor element;

a step of forming a third conductive layer onto said fourth insulation film layer, and said third conductive layer being used as a storage electrode of said capacitor element;

a step of removing said fourth insulation film layer by an etching method down to the surface of said second insulation film layer; and a step of forming a capacitor insulation film covering said storage electrode of said capacitor element.

8. A method of producing a semiconductor memory device as claimed in claim 7, wherein said first, second and third conductive layers are constituted by polycrystal silicon layers, said first, third and fourth insulation film layers are constituted by $SiO_2$ film layers, and said second insulation film layer is constituted by a $Si_3N_4$ film layer.

9. A method of producing a semiconductor memory device as claimed in claim 1, wherein the step of removing said second conductive layer, said capacitor insulation film and at least a part of said second insulation layer comprises:

a step of patterning a resist to expose an area of said second semiconductor element by using a photolithography technique; and a step of etching said conductive layer and at least said top insulation layer by using said resist as a mask.

* * * * *